United States Patent
Korsunsky et al.

(10) Patent No.: US 7,114,974 B2
(45) Date of Patent: Oct. 3, 2006

(54) ELECTRICAL CONNECTOR ASSEMBLY HAVING BOARD HOLD DOWN

(75) Inventors: Iosif R. Korsunsky, Harrisburg, PA (US); Tod M. Harlan, Mechanicsburg, PA (US); Brian J. Gillespie, Harrisburg, PA (US); Joanne E. Shipe, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/040,444

(22) Filed: Jan. 19, 2005

(65) Prior Publication Data
US 2006/0160424 A1 Jul. 20, 2006

(51) Int. Cl.
*H01R 13/62* (2006.01)
(52) U.S. Cl. .................. 439/325; 439/637; 361/758
(58) Field of Classification Search ............ 439/637, 439/325–328; 361/758–759
See application file for complete search history.

(56) References Cited

U.S. PATENT DOCUMENTS

| | | | |
|---|---|---|---|
| 3,701,071 A * | 10/1972 | Landman .................. 200/5 R |
| 5,484,302 A | 1/1996 | Yamada et al. ............. 439/326 |
| 6,955,554 B1 * | 10/2005 | Korsunsky et al. ......... 439/328 |
| 6,971,899 B1 * | 12/2005 | Liu ............................ 439/326 |
| 7,004,764 B1 * | 2/2006 | Boudreau et al. ............ 439/74 |
| 2004/0152353 A1 * | 8/2004 | Kawamae ................... 439/328 |

FOREIGN PATENT DOCUMENTS

DE 0776152 * 11/1996

* cited by examiner

*Primary Examiner*—Michael C. Zarroli
(74) *Attorney, Agent, or Firm*—Wei Te Chung

(57) ABSTRACT

An electrical connector assembly (1) includes a card edge connector (20) used to be mounted on a mother board (10) and defining a slot (210), a daughter card (30), and a board hold down (40) for being mounted on the mother board. The daughter card includes a mating edge (31) inserted into the slot of the card edge connector, and a rear edge (32) opposite to the mating edge and defining an engaging hole (320). The board hold down is separated from the card edge connector and includes a pivot bracket (42) engaged with the engaging hole of the daughter card, and a pin latch (44) pivoted on the pivot bracket and having a latch portion (442) abutting against the rear edge of the daughter card for preventing the rear edge from rising upwardly.

18 Claims, 7 Drawing Sheets

ELECTRICAL CONNECTOR ASSEMBLY HAVING BOARD HOLD DOWN

CROSS-REFERENCE TO RELATED APPLICATIONS

Relevant subject matters disclosed in U.S. patent application Ser. No. 10/766,158 filed on Jan. 27, 2004, new U.S. Pat. No. 6,955,554, and a contemporarily filed application, both of which are entitled "ELECTRICAL CONNECTOR ASSEMBLY HAVING BOARD HOLD DOWN", and are assigned to the same assignee as this application.

BACKGROUND OF THE INVENTION

1. Field of the Invention

The present invention relates to an electrical connector assembly, and particularly to an assembly having a board hold down for detachably holding a circuit board to another circuit board thereof.

2. Description of Related Art

Card edge connectors, such as PCI (Peripheral Component Interconnect) and PCI Express connectors, are widely used to connect daughter cards and mother boards. Typically, each of the card edge connectors generally comprises an elongate housing defining an elongate slot for receiving a mating edge of the daughter card, a plurality of terminals disposed along one or two sides of the slot for engaging conductive pads disposed on the mating edge of the daughter card, and a pair of latch members attached to opposite ends of the housing. For example, U.S. Pat. No. 5,484,302 (the '302 patent) shows such a card edge connector.

The card edge connector of the '302 patent is arranged to be mounted on a mother board and to hold a daughter card in an orientation which is parallel to the mother board. The card edge connector has discrete metal latches held in guide frames which extend outwardly from opposite ends of a housing. A plurality of terminals are received in the housing and have solder tails electrically connected to the mother board by surface mount technology. The latches have integral solder tabs which are also attached to the mother board by surface mounting technology to increase the retention of the card edge connector to the mother board and to reduce stress imposed on the solder connections of the terminals. The solder tails of the terminals and the solder tabs of the latches must be coplanar so that good solder joints can be produced, but it is difficult to ensure a close coplanarity tolerance on these parts. Also, the latches should extend precisely perpendicular to the housing for effectively latching the daughter card and for proper alignment with solder pads on the mother board. There is a need for the card edge connector having improved means for accurately positioning the latches. Further, the guide frames increase a longitudinal dimension of the housing, so large space of the mother board is occupied by the card edge connector. This problem is especially critical in some applications where several card edge connectors are arranged on the mother board side by side.

Hence, an electrical connector assembly having an improved board hold down to solve the above problems is desired.

SUMMARY OF THE INVENTION

An object of the present invention is to provide an electrical connector assembly having a daughter card which can accurately and reliably engage with a card edge connector thereof.

Another object of the present invention is to provide an electrical connector assembly having a card edge connector which occupies small space of a mother board thereof.

To achieve the above objects, an electrical connector assembly in accordance with the present invention comprises a card edge connector used to be mounted on a mother board and defining a slot, a daughter card, and a board hold down for being mounted on the mother board. The daughter card includes a mating edge inserted into the slot of the card edge connector, and a rear edge opposite to the mating edge and defining an engaging hole. The board hold down is separated from the card edge connector and includes a pivot bracket engaged with the engaging hole of the daughter card, and a pin latch pivoted on the pivot bracket and having a latch portion abutting against the rear edge of the daughter card for preventing the rear edge from rising upwardly.

Other objects, advantages and novel features of the invention will become more apparent from the following detailed description when taken in conjunction with the accompanying drawings.

DETAILED DESCRIPTION OF THE PREFERRED EMBODIMENT

Figure 1:
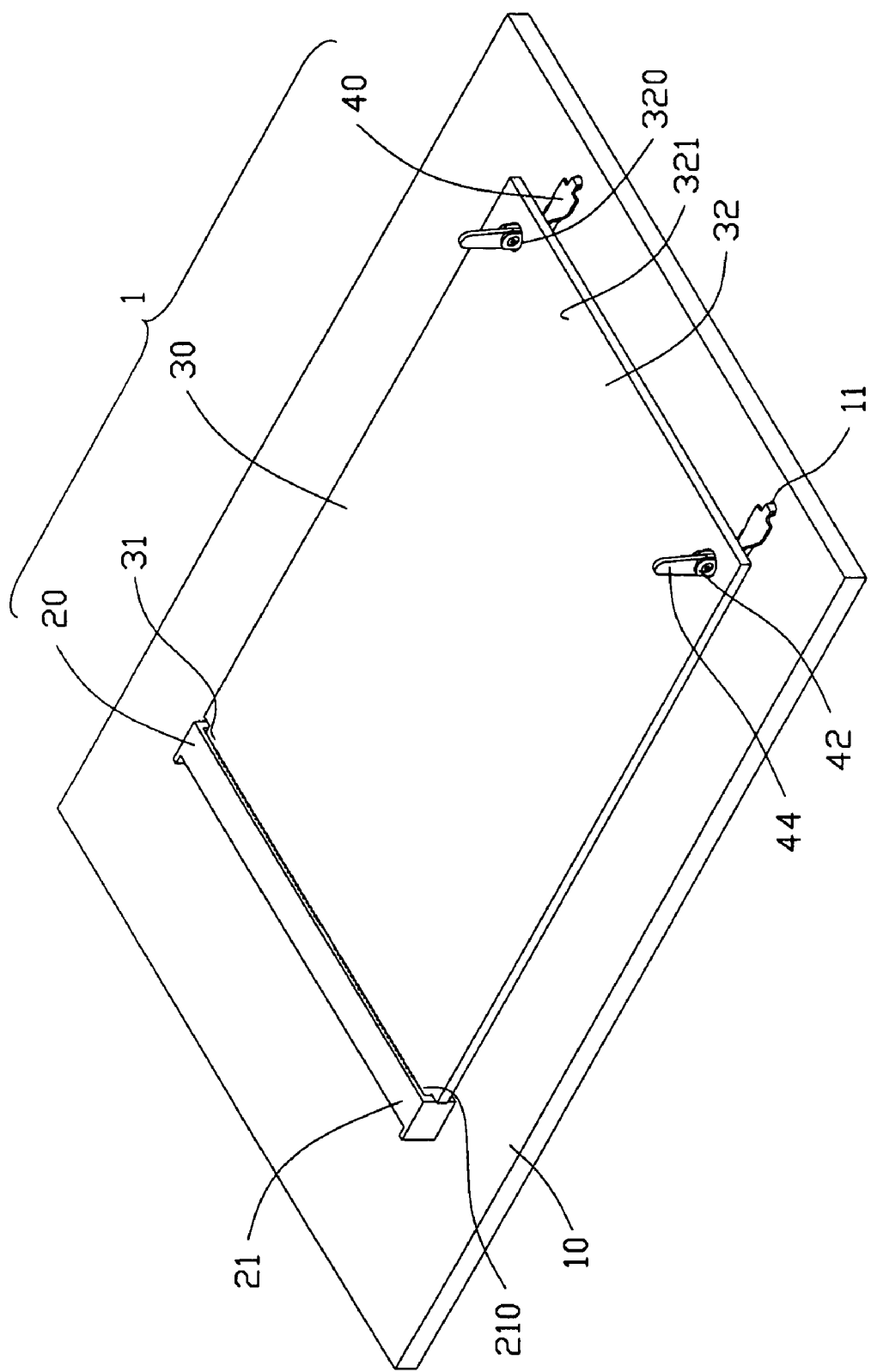
FIG. 1 is an assembled perspective view of an electrical connector assembly in accordance with a first embodiment of the present invention, showing a pair of board hold downs mounted on a mother board and in an open position.
Figure 2:
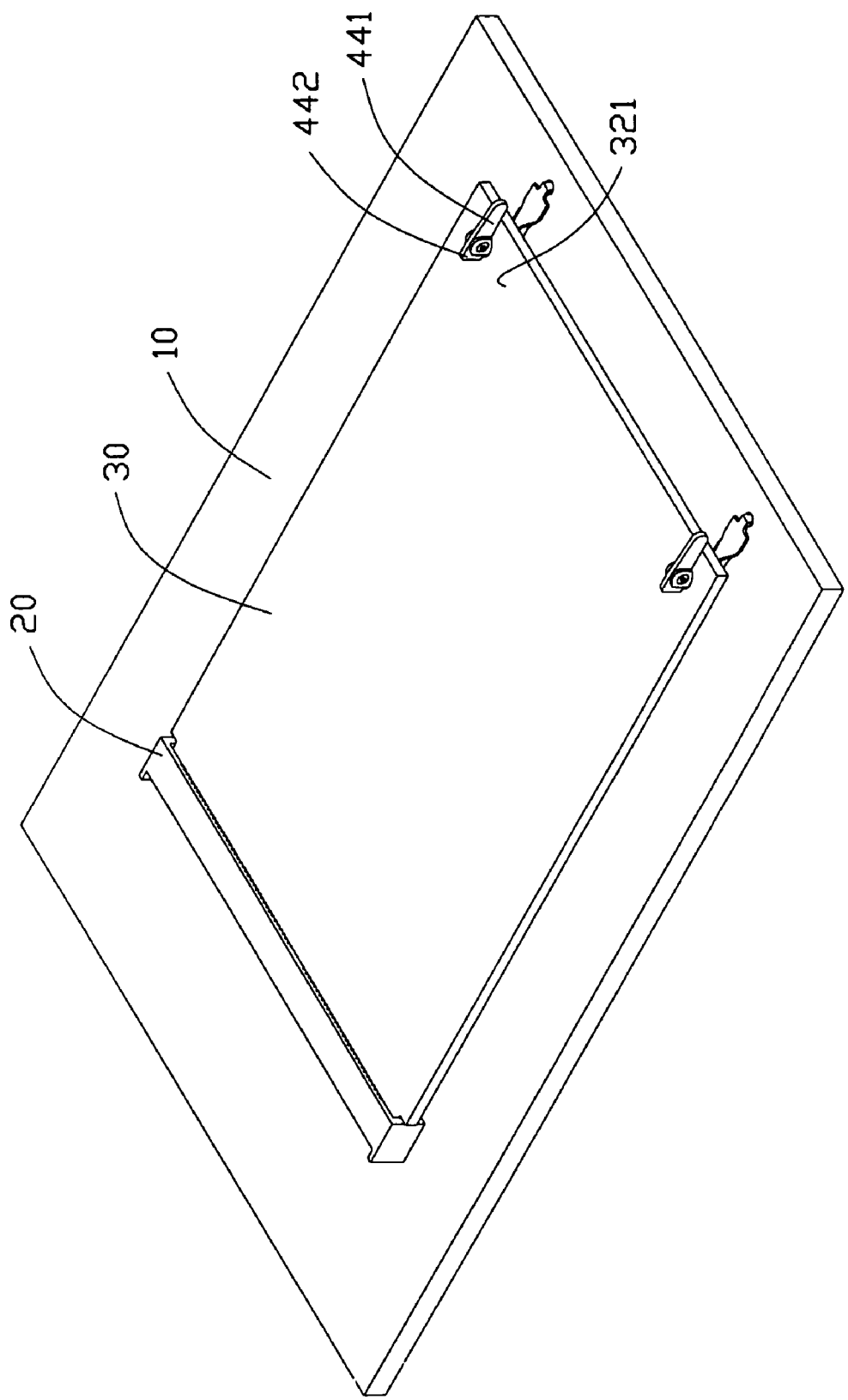
FIG. 2 is a view similar to FIG. 1 but showing the board hold downs in a locked position.

Referring to FIGS. 1 and 2, an electrical connector assembly 1 in accordance with a first embodiment of the present invention comprises a card edge connector 20 adapted to be mounted on a mother board 10, a daughter card 30, and a pair of board hold downs 40.

The mother board 10 defines a front-to-rear direction, two pairs of retention holes 11 adjacent to a rear end thereof. The card edge connector 20 comprises an elongate housing 21 seated on a front end of the mother board 10 and a plurality of contacts (not shown) received in the housing 21. The housing 21 defines a slot 210 at a rear side thereof and extending along a longitudinal direction thereof. The contacts are disposed at opposite sides of the slot 210 of the housing 21 and extend out of the housing 21 for soldering to the mother board 10. The daughter card 30 comprises a mating portion 31 inserted into the slot 210 of the card edge connector 20 and a rear portion 32 opposite to the mating portion 31. The rear portion 32 defines a pair of engaging holes 320 adjacent to opposite side edges thereof.

Figure 3:
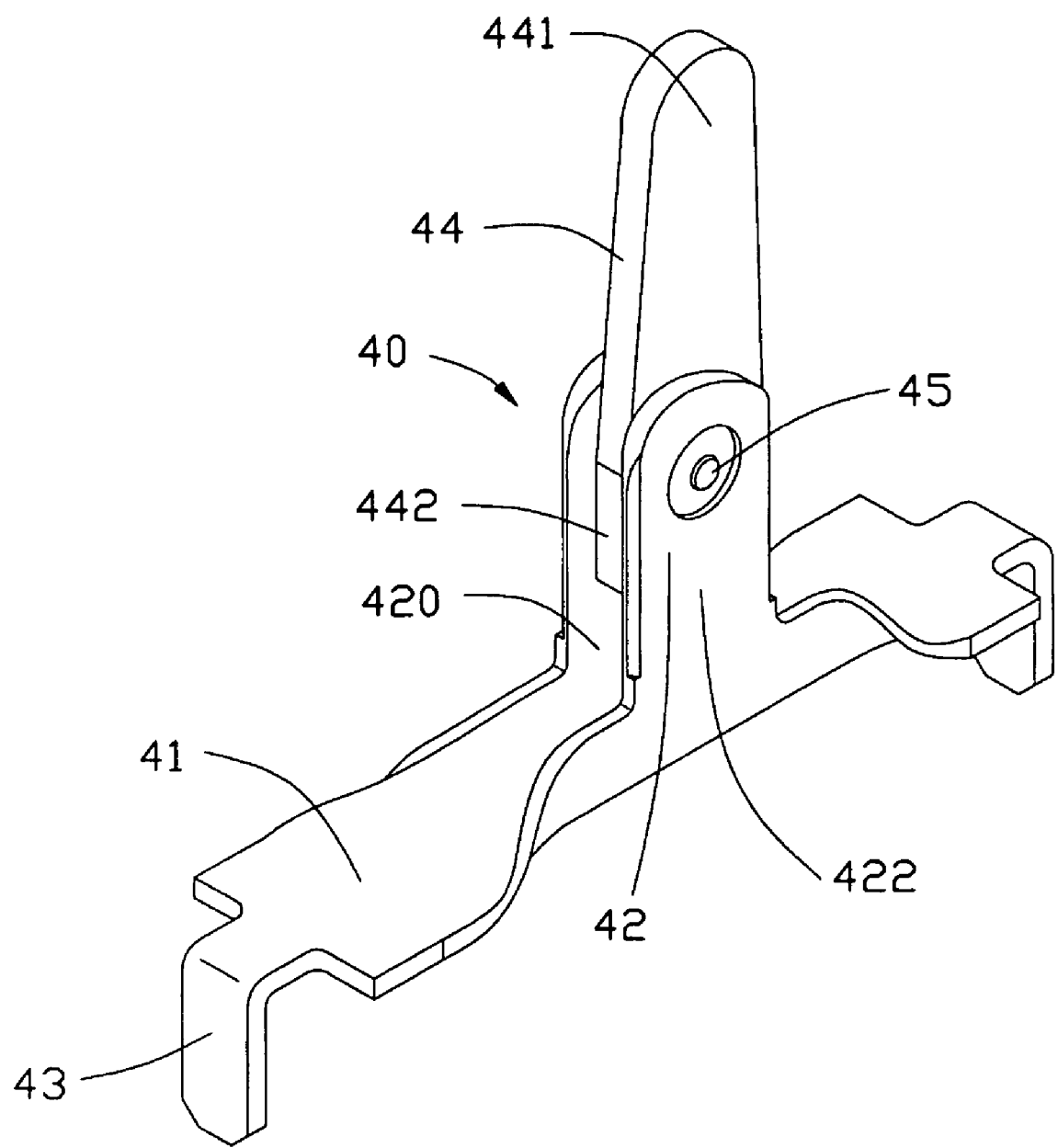
FIG. 3 is an enlarged perspective view of one of the board hold downs of the electrical connector assembly of FIG. 1.
Figure 4:
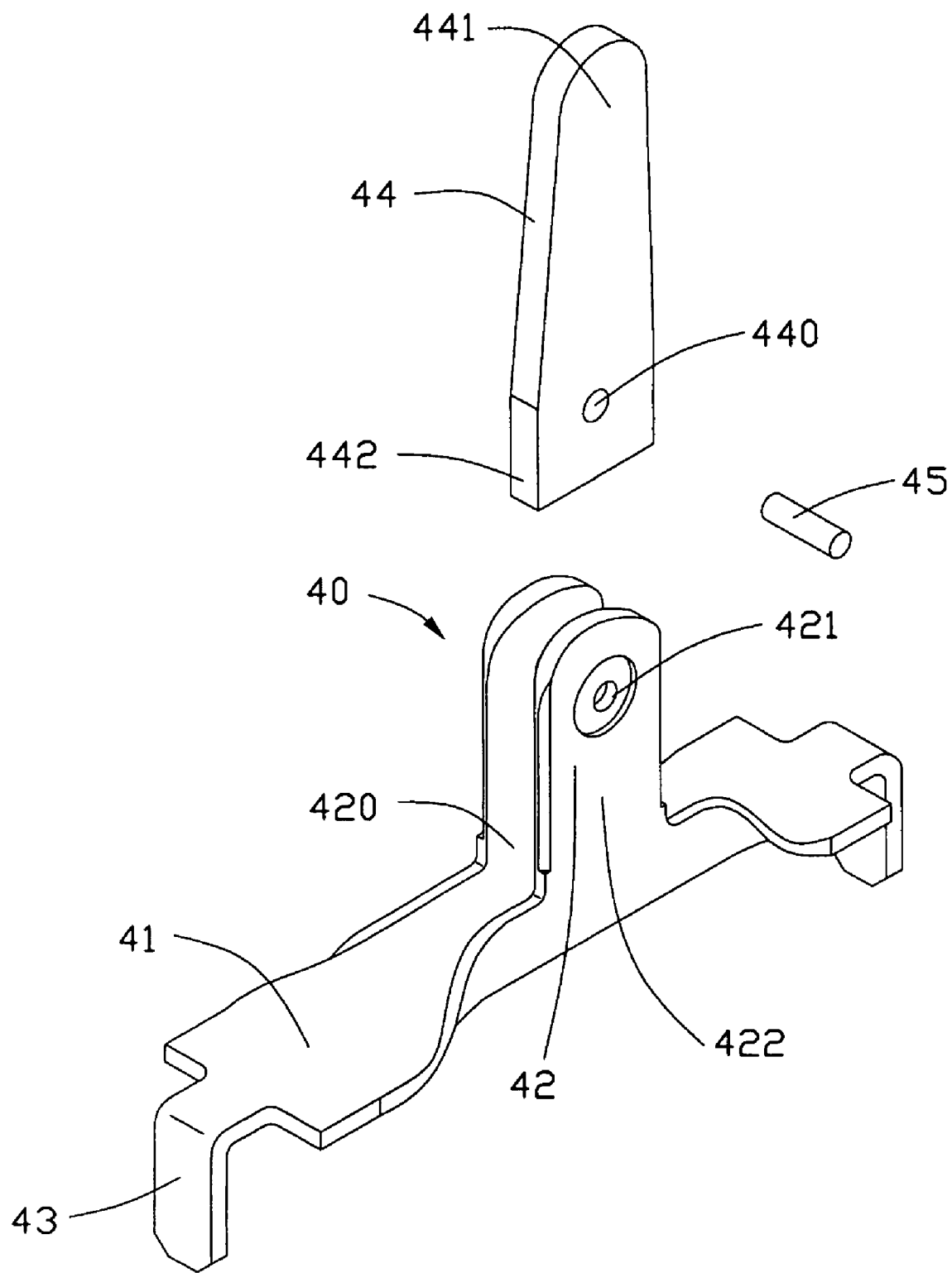
FIG. 4 is an exploded perspective view of the board hold down of FIG. 3.

Referring to FIGS. 3 and 4 in conjunction with FIGS. 1 and 2, each of the board hold downs 40 comprises a body portion 41, a pivot bracket 42 upwardly extending from a middle portion of the body portion 41, a pair of leg portions 43 extending downwardly from opposite ends of the body portion 41 and inserted into a corresponding pair of retention holes 11 of the mother board 10, a pin latch 44, and a spindle 45. The pivot bracket 42 comprises a pair of plates 422 spaced from each other to define a channel 420 therebetween. The plates 422 defines a pair of pivot holes 421. The pin latch 44 defines a through hole 440 adjacent to a lower end thereof. The spindle 45 passes through the through hole 440 of the pin latch 44 with opposite ends thereof received in the pivot holes 421 of the pivot bracket 42 for allowing the pin latch 44 to rotate between an open position and a locked position around the spindle 45. The pin latch 44 includes a tapered operating portion 441 above the through hole 440 and a latch portion 442 below the through hole 440.

Referring back to FIGS. 1 and 2, in assembly, the card edge connector 20 is mounted on the mother board 10. The pair of leg portions 43 of each of the board hold downs 40 are inserted into the retention holes 11 of the mother board 10 and soldered in the retention holes 11 for retaining the board hold downs 40 to the mother board 10. The mating portion 31 of the daughter card 30 is inclinedly inserted into the slot 210 of the card edge connector 20 to establish an electrical connection between the daughter card 30 and the card edge connector 20. The rear portion 32 of the daughter card 30 is then pivoted downwardly. Meanwhile, the pin latches 44 of the board hold downs 40 is in their open positions for guiding the engaging holes 320 of the daughter card 30 to engage with the pivot brackets 42 of the board hold downs 40. A slight and downward pressing force is exerted on the rear portion 32 of the daughter card 30, and then the pin latches 44 are rearwardly rotate to their locked positions where the latches 44 abut against an upper face 321 of the rear portion 32 of the daughter card 30 and span the engaging holes 320 in the front-to-rear direction, that is, the latching portions 442 is at back of the holes 320 while the operation portion 441 is at front of the holes 320. After the pressing force exerted on the rear portion 32 of the daughter card 30 is removed, the rear portion 32 resumes upwardly with the upper face 321 thereof obstructed by the latch portions 442 of the pin latches 44, preventing the rear portion 32 from further upwardly moving. Thus, a correct engagement between the daughter card 30 and the card edge connector 20 is established. To withdraw the daughter card 30 from the card edge connector 20, slightly and downwardly pressing the rear portion 32 of the daughter card 30, and then rotating the pin latches 44 to their open positions, the rear portion 32 rises up automatically, whereby the daughter card 30 is easily removed from the card edge connector 20.

Figure 5:
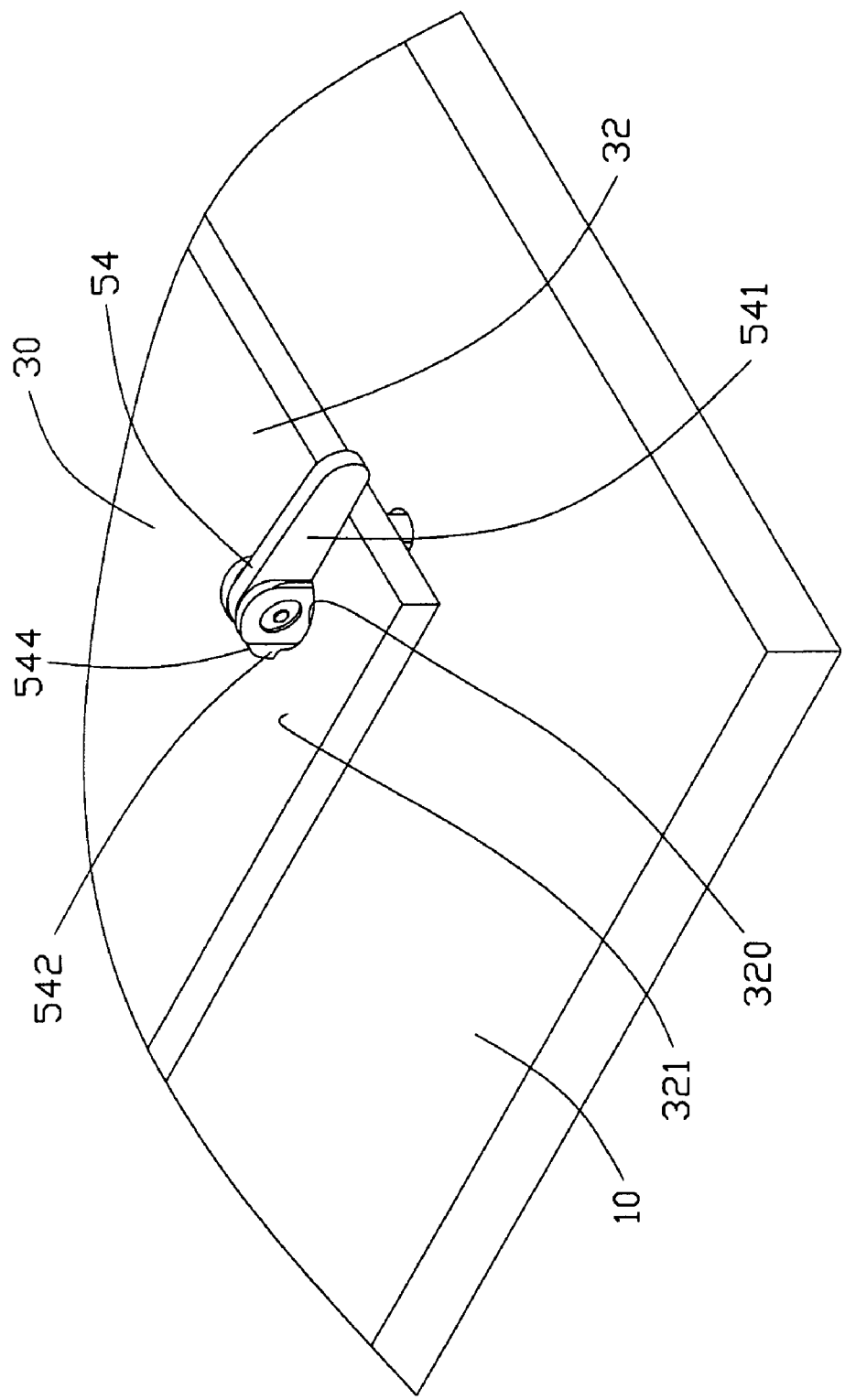
FIG. 5 is a partially assembled perspective view of an electrical connector assembly in accordance with a second embodiment of the present invention, showing a board hold down mounted on the mother board and in a locked position.
Figure 6:
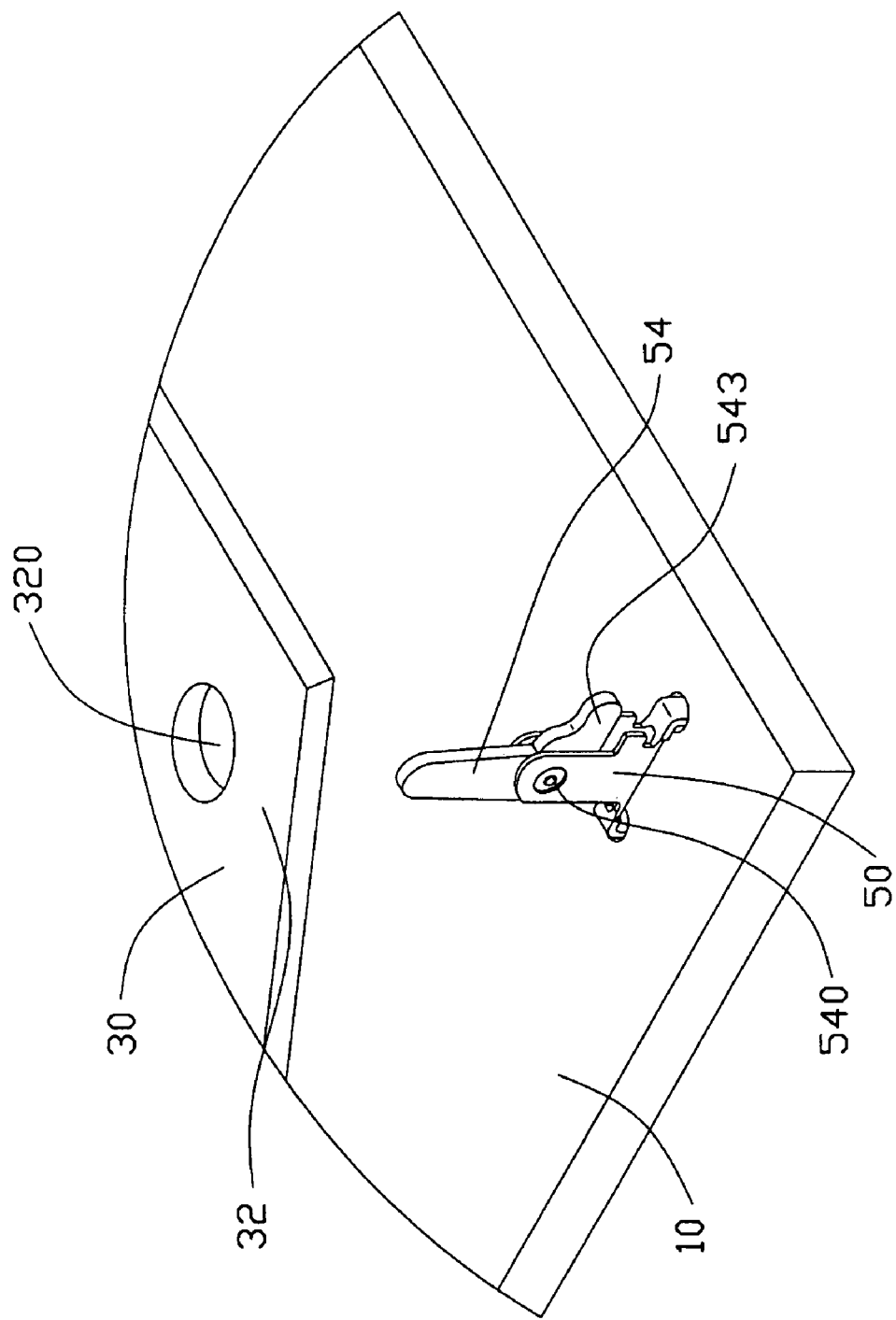
FIG. 6 is a partially perspective view of the electrical connector assembly shown in FIG. 5, showing the board hold down in an open position.
Figure 7:
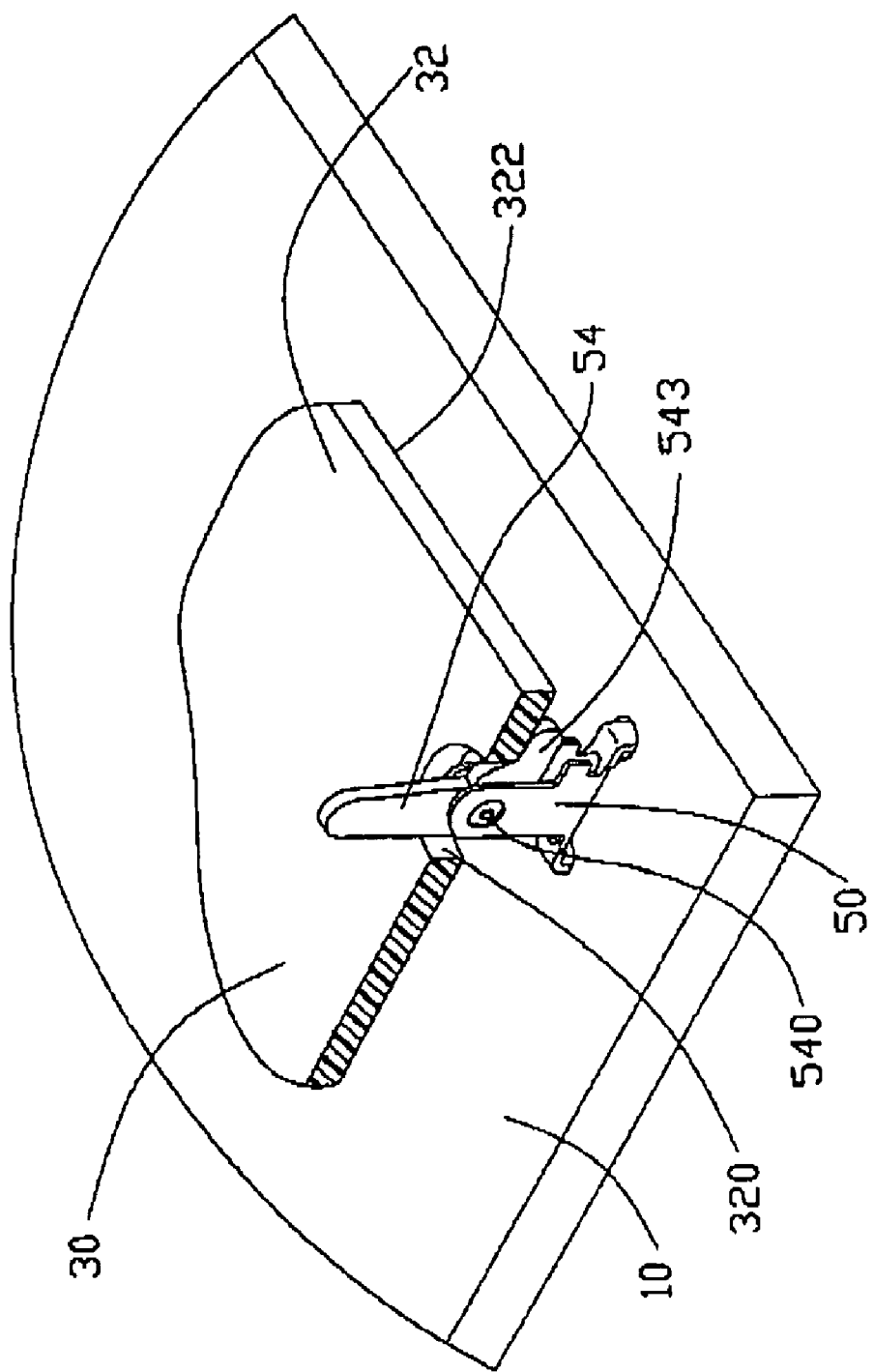
FIG. 7 is a partially cut-away perspective view of the electrical connector assembly shown in FIG. 5, showing a condition in which the board hold down is in the open position, and an associated ejector of the board hold down abuts against an undersurface of the daughter card when the daughter card is to be unlocked from the mother board.

Referring to FIGS. 5 to 7, a board hold down 50 in accordance with a second embodiment of the present invention is substantially identical to the board hold downs 40 of the first embodiment in configuration and structure except that the latch portion 542 of the pin latch 54 thereof has an arced face 544 and that the pin latch 54 has a laterally extending associated ejector 543 below the through holes 540. When the daughter card 30 is inserted into the card edge connector 20 and the pin latches 54 of the board hold downs 50 are rotated to their locked positions, the latch portions 542 of the pin latches 54 of the board hold downs 50 abuts against the upper face 321 of the rear portion 32 of the daughter card 30 to prevent the rear portion 32 form rising upwardly. When the pin latches 54 rotate to their open positions for allowing the daughter card 30 to be removed from the card edge connector 20, as clearly shown in FIG. 7, the associated ejector 543 of the pin latches 54 assist to lift the rear portion 32 of the daughter card 30 for easily removing the daughter card 30 from the card edge connector 20 via abutting against an undersurface 322 of the daughter card 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector assembly, comprising:
a card edge connector adapted for mounting on a mother board and defining a slot;
a daughter card comprising a mating portion inserted into the slot of the card edge connector, and a rear portion opposite to the mating portion and defining an engaging hole; and
a board hold down separated from the card edge connector for mounting on the mother board and latchably engaged with the engaging hole of the daughter card, the board hold down comprising a pivot bracket engaged with the mother board and a latch pivotally assembled on the pivot bracket and abutting against the rear portion of the daughter card for preventing the rear portion from rising upwardly wherein, the latch of the board hold down comprises a laterally extending associated ejector to abut against an undersurface of the daughter card for ejecting the daughter card away from the mother board when the latch is in its open position.

2. The electrical connector assembly as claimed in claim 1, wherein the board hold down comprises a body portion and a pair of leg portions extending downwardly from opposite ends of the body portion to engage with the mother board.

3. The electrical connector assembly as claimed in claim 2, wherein the pivot bracket of the board hold down comprises two plates extending upwardly from the body portion and spaced from each other to define a channel therebetween to receive the latch.

4. The electrical connector assembly as claimed in claim 3, wherein the board hold down comprises a spindle passing through a through hole of the latch with opposite ends thereof received in a pair of pivot holes of the pivot bracket for allowing the pin latch rotate around the spindle.

5. The electrical connector assembly as claimed in claim 1, wherein the board hold down comprises a spindle disposed thereon, the latch pivoting around the spindle.

6. The electrical connector assembly as claimed in claim 1, wherein the latch having a latch portion with an arced face.

7. The electrical connector assembly as claimed in claim 1, wherein the latch is pivotable relative to the bracket, from an open position where the latch is disengaged with the daughter card to a locked position where the latch abutting against an upper face of the rear portion of the daughter card.

8. The electrical connector assembly as claimed in claim 7, wherein the open position of the latch differs from the locked position thereof.

9. An electrical connector assembly comprising:
a printed circuit board;
a card edge connector located on one position of said printed circuit board;
a board hold down located on another position of the printed circuit board far from said one position in a front-to-rear direction; and
a daughter board parallel disposed above said printed circuit board, said daughter board including a first end connected to the card edge connector and a second end, opposite to said first end, latchably engaged with the board hold down; wherein,
said daughter board defines a through hole proximate said second end, and said board hold down extends through said through hole;
wherein the board hold down comprises an immovable pivot bracket secured to the printed circuit board and a movable latch pivoted disposed on the bracket, the latch abutting against a top face of the daughter board for preventing upward movement of the daughter board.

10. The assembly as claimed in claim 9, wherein the latch abuts against the daughter board in a manner of spanning the through hole of the daughter board.

11. The assembly as claimed in claim 9, wherein said pivot bracket includes a top portion upwardly extending into said through hole.

12. The assembly as claimed in claim 9, wherein said movable pivot latch further includes an associated ejector which push an undersurface of the daughter board and eject the daughter board away from the printed circuit board when said pivot latch is located in a position to no longer abut against the top face of the daughter board.

13. The assembly as claimed in claim 9, wherein said movable pivot latch comprises an operation portion extending beyond the second end of the daughter board in the front-to-rear direction when said pivot latch abuts against the top face of the daughter board.

14. A method of assembling a daughter board to a mother board in a parallel relation, comprising steps of:

providing a mother board with a card edge connector at one position and a board hold down at another position spaced from said one position, said board hold down comprising an immovable bracket secured to the mother board and a movable latch pivotally mounted to the immovable bracket;

providing a daughter board with a through hole proximate one end thereof;

inserting another end of the daughter board into the card edge connector and downwardly moving said one end of the daughter board toward the mother board in a rotation manner until the movable latch extends through said through hole and the daughter board is moved to a parallel position with regard to the mother board; and pivoting the latch to a locked condition in which the latch abuts against a top face of the daughter board to secure the daughter board in the parallel position relative to the mother board.

15. The method as claimed in claim 14, wherein said movable latch is pivotable relative to the immovable bracket, from a vertical position to allow the through hole of the daughter board to pass over the latch to a horizontal position to have the movable latch securing said daughter board in the parallel relation with the mother board.

16. The method as claimed in claim 15, wherein said movable latch further includes an associated ejector adapted to abut against an undersurface of the daughter board to eject said daughter board away from the mother board when said latch is in the vertical position.

17. The method as claimed in claim 15, wherein the movable latch spans the through hole of the daughter board when the latch is in its horizontal position.

18. The method as claimed in claim 14, wherein the board hold down is provided with a spindle thereon, the movable latch pivoting around the spindle.

* * * * *